United States Patent
Emira et al.

(10) Patent No.: US 10,879,916 B1
(45) Date of Patent: Dec. 29, 2020

(54) FRACTIONAL DIVIDER FOR MODULATED PHASE-LOCK LOOP CIRCUITS

(71) Applicant: GOODIX TECHNOLOGY INC., San Diego, CA (US)

(72) Inventors: Ahmed Emira, San Diego, CA (US); Faisal Hussien, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/432,916

(22) Filed: Jun. 5, 2019

(51) Int. Cl.
 *H03L 7/197* (2006.01)
 *H03L 7/099* (2006.01)
 *H03L 7/093* (2006.01)

(52) U.S. Cl.
 CPC ............ *H03L 7/1974* (2013.01); *H03L 7/093* (2013.01); *H03L 7/099* (2013.01)

(58) Field of Classification Search
 CPC ..... G06F 1/00; G06F 1/08; G06F 7/00; G06F 7/68; H03K 23/00; H03K 23/667; H03K 23/68; H03K 5/00; H03K 5/00006; H03L 7/00; H03L 7/093; H03L 7/099; H03L 7/1974
 USPC ...................................................... 327/115
 See application file for complete search history.

(56) References Cited

U.S. PATENT DOCUMENTS

| 8,664,988 | B1 | 3/2014 | Xiu |
| 8,674,731 | B1 | 3/2014 | Hellmer et al. |
| 2002/0140512 | A1* | 10/2002 | Stockton .................. H03L 7/087 331/11 |
| 2006/0290391 | A1 | 12/2006 | Leung et al. |
| 2013/0300467 | A1 | 11/2013 | Eldredge et al. |
| 2017/0338940 | A1* | 11/2017 | Zanuso .................... H04L 7/033 |

FOREIGN PATENT DOCUMENTS

| CN | 101409555 A | 4/2009 |
| CN | 105049039 A | 11/2015 |

OTHER PUBLICATIONS

International Search Report dated Mar. 9, 2020 in the corresponding international application (application No. PCT/CN2019/118687).

* cited by examiner

*Primary Examiner* — Lincoln D Donovan
*Assistant Examiner* — Dave Mattison
(74) *Attorney, Agent, or Firm* — Kilpatrick Townsend & Stockton LLP (57) ABSTRACT

Techniques are described for implementing fractional dividers in modulated phase-lock loop circuits. For example, a fractional divider can receive a base dividing value having integer and fractional components (e.g., corresponding to a carrier frequency produced by multiplying the dividing value by a reference frequency). The fractional divider can also receive a data signal to modulate the dividing value. Embodiments use a shift value (e.g., preset, or received via a shift input signal) to selectively shift and scale the modulated dividing value to generate a shifted fractional component value. The shifted fractional component value can be added to the base integer component, and de-shifted and de-scaled to generate a corrected dividing value. A feedback signal can then be generated by sequentially dividing a frequency of a clock output signal by the corrected dividing value.

20 Claims, 5 Drawing Sheets

FIG. 1

(Prior Art)

FRACTIONAL DIVIDER FOR MODULATED PHASE-LOCK LOOP CIRCUITS

FIELD OF THE INVENTION

The present invention relates generally to oscillator circuits. More particularly, embodiments of the present invention relate to fractional dividers for modulated phase-lock loop circuits.

BACKGROUND OF THE INVENTION

Many types of electronic applications can include clock circuits, or the like, which can rely on a stable frequency reference. Some such applications use a crystal oscillator, or other suitably accurate oscillator, to generate a reference frequency. The reference frequency can then be fed into a phase-locked loop (PLL), which can output some desired multiple of the reference frequency. Typically, the PLL has a feedback loop that includes a divider, and the output of the divider is fed back as an input to the PLL, along with the reference frequency. In that way, a dividing value associated with the divider can be used effectively to control the multiple relationship between the PLL output frequency and the reference frequency.

In some applications, it is desirable for the PLL to output a fractional (i.e., non-integer) multiple of the reference frequency. In such applications, a so-called fractional divider PLL can be used. According to conventional approaches, the divider in a fractional divider PLL alternates among multiple integer dividing values over time, such that the result, on average, is effectively a fractional dividing value. In some applications, however, is desirable to modulate the output frequency of the PLL. For example, a data signal is received as an input to the fractional divider, such that the output of the PLL is a frequency-modulated signal that represents the data signal by frequency-modulating a carrier frequency. In such applications, conventional approaches to generating fractional dividing values in a PLL tend to produce undesirable results.

BRIEF SUMMARY OF THE INVENTION

Embodiments provide circuits, devices, and methods for implementing fractional dividers in modulated phase-lock loop circuits. For example, a fractional divider can receive a base dividing value having integer and fractional components (e.g., corresponding to a carrier frequency produced by multiplying the dividing value by a reference frequency). The fractional divider can also receive a data signal to modulate the dividing value. Embodiments use a shift value (e.g., one or more preset shift values, and/or a value settable by a shift input signal) to selectively shift and scale the modulated dividing value to generate a shifted fractional component value. The shifted fractional component value can be added to the base integer component, and de-shifted and de-scaled to generate a corrected dividing value. A feedback signal can then be generated by sequentially dividing a frequency of a clock output signal by the corrected dividing value.

According to one set of embodiments, a fractional divider phase-locked loop (PLL) system is provided. The system includes: a phase comparison block to output a phase comparison signal as a function of comparing an input reference clock signal with a feedback signal, the input reference clock signal received at a reference frequency, and the feedback signal received at a feedback frequency; a loop filter block coupled with the phase comparison block to output a control signal as a function of filtering the phase comparison signal; an oscillator block coupled with the loop filter block to output a clock output signal at an output frequency responsive to the control signal; and a shifting fractional divider subsystem. The shifting fractional divider subsystem includes: a plurality of input nodes to receive the clock output signal, a dividing value signal, and a data signal, the dividing value signal indicating a base dividing value having a base integer component and a base fractional component; a fractional shifting modulator coupled with at least some of the plurality of input nodes to generate a shifted fractional component value as a function of the base fractional input signal, the data signal, and a shift value; a fractionalizer coupled with the fractional shifting modulator to generate a first stream of integers responsive to receiving the shifted fractional component value, such that the first stream of integers time-averages to the shifted fractional component value; an integer de-shifter coupled with the fractionalizer to generate a second stream of integers by de-shifting a sum of the first stream of integers and the base integer component, such that the second stream of integers time-averages to a modulated dividing value, the modulated dividing value corresponding to the base dividing value as modulated by the data signal; a divider coupled with the integer de-shifter to generate the feedback signal as a function of sequentially dividing a frequency of a clock output signal by the second stream of integers; and an output node coupled with the phase comparison block to provide the feedback signal to the phase comparison block, such that the output frequency is a multiple of the reference frequency, the multiple being controlled by the shifting fractional divider subsystem.

According to another set of embodiments, a fractional divider system is provided. The system includes: a plurality of input nodes to receive a dividing value signal, and a data signal, the dividing value signal indicating a base dividing value having a base integer component and a base fractional component; a fractional shifting modulator coupled with at least some of the plurality of input nodes to generate a shifted fractional component value as a function of the base fractional input signal, the data signal, and a shift value; a fractionalizer coupled with the fractional shifting modulator to generate a first stream of integers responsive to receiving the shifted fractional component value, such that the first stream of integers time-averages to the shifted fractional component value; an integer de-shifter coupled with the fractionalizer to generate a second stream of integers by de-shifting a sum of the first stream of integers and the base integer component, such that the second stream of integers time-averages to a modulated dividing value, the modulated dividing value corresponding to the base dividing value as modulated by the data signal; and a divider coupled with the integer de-shifter to generate a feedback signal as a function of sequentially dividing a frequency of a clock output signal by the second stream of integers.

According to another set of embodiments, a method is provided for fractionally dividing a clock output signal to generate a feedback signal. The method includes: receiving a dividing value signal and a data signal, the dividing value signal indicating a base dividing value having a base integer component and a base fractional component; generating a shifted fractional component value as a function of the base fractional input signal, the data signal, and a shift value; generating a first stream of integers responsive to generating the shifted fractional component value, such that the first stream of integers time-averages to the shifted fractional component value; generating a second stream of integers by de-shifting a sum of the first stream of integers and the base integer component, such that the second stream of integers time-averages to a modulated dividing value, the modulated dividing value corresponding to the base dividing value as modulated by the data signal; and generating the feedback signal as a function of sequentially dividing a frequency of the clock output signal by the second stream of integers.

BRIEF DESCRIPTION OF THE DRAWINGS

The accompanying drawings, referred to herein and constituting a part hereof, illustrate embodiments of the disclosure. The drawings together with the description serve to explain the principles of the invention.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Figure 1:
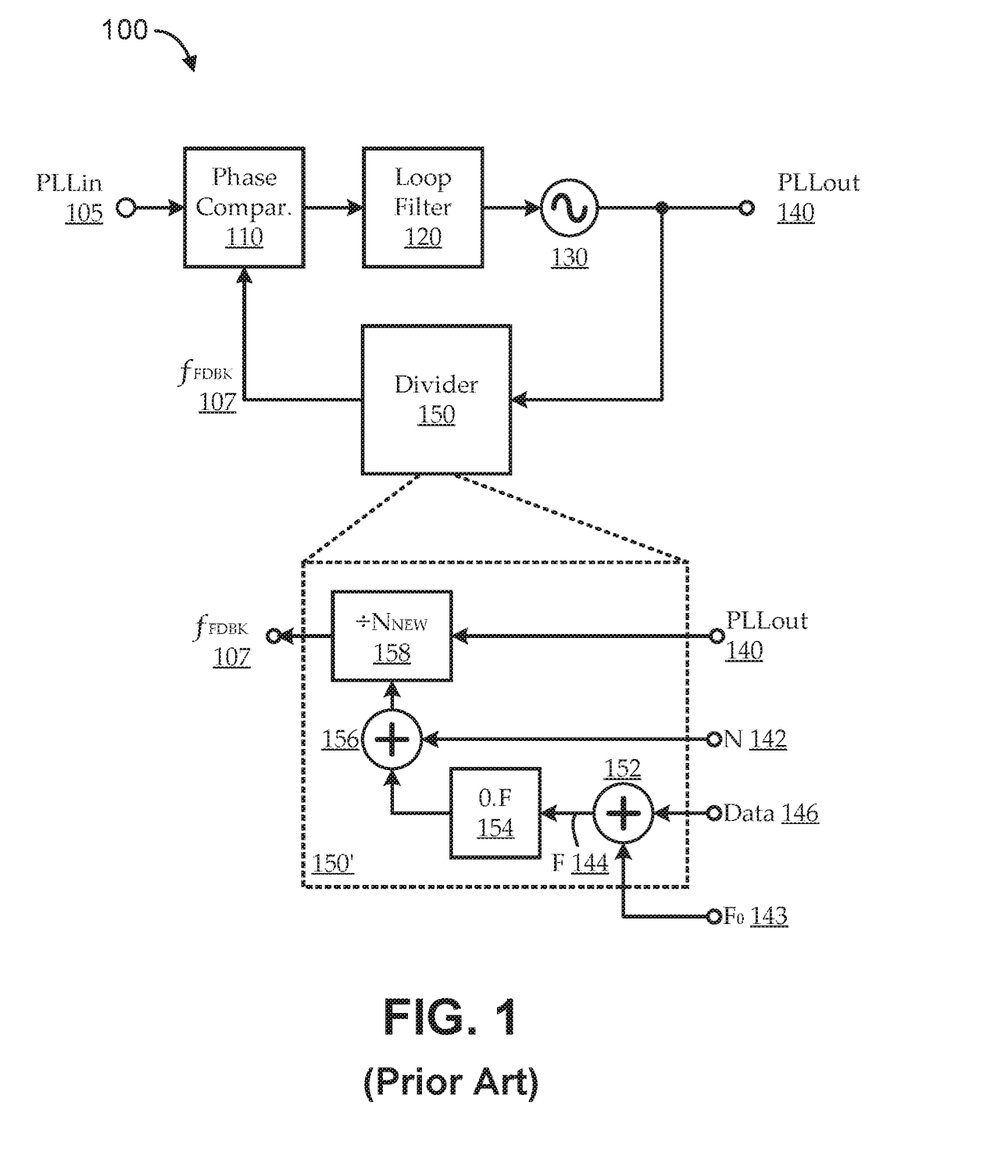
FIG. 1 shows an illustrative phase-locked-loop system, as context for various embodiments.

FIG. 1 shows an illustrative phase-locked-loop (PLL) system 100, as context for various embodiments. The PLL system 100 generates a PLL output signal (PLLout) 140 in accordance with a received PLL input signal (PLLin) 105. For example, PLLin 105 can be a clock reference signal generated by a crystal oscillator, or the like, at a particular input frequency. The PLL system 100 uses a feedback loop to generate PLLout 140 in such a way that PLLout 140 is locked to a desired output frequency (e.g., a multiple of the input frequency of PLLin 105).

As illustrated, the PLL system 100 includes a phase comparison block 110, a loop filter block 120, a voltage controlled oscillator block 130, and a divider block 150. The phase comparison block 110 can be implemented as a phase/frequency detector (PFD), or any other suitable component, that receives PLLin 105 at an input reference frequency ($f_{REF}$) and compares PLLin 105 with a signal fed back by the feedback loop of the PLL system 100. The fed back signal is at a feedback frequency ($f_{FDBK}$) 107. The output of the phase comparison block 110 is a function of the comparison and is fed to the loop filter block 120. The loop filter block 120 can include any suitable components for facilitating filtering over the feedback loop, such as a charge pump and a low-pass filter. The output of the loop filter block 120 can be used as a control voltage for controlling the VCO block 130. The VCO block 130 can include any suitable oscillator, such as an inductive-capacitive (LC) oscillator, a ring oscillator, etc.

The output frequency of the PLL system 100 (i.e., the frequency of PLLout 140), or $f_{OUT}$, is a function of a dividing value associated with the divider block 150. For example, if the divider block 150 is designed to divide $f_{OUT}$ by N (e.g., where N is a non-zero integer), the PLL system 100 will seek to lock $f_{OUT}$ to a frequency that is N times $f_{REF}$ (the frequency of PLLin 105). In that way, the dividing value associated with the divider block 150 can effectively define the mathematical relationship between the frequencies of PLLout 140 and PLLin 105, thereby effectively controlling $f_{OUT}$.

Some applications of such a PLL system 100 can exploit the ability of the divider block 150 to control $f_{OUT}$ for use in frequency modulation. For example, frequency modulation (FM) transmitters can use a data signal to modulate the frequency of a carrier signal, such that modulations in the carrier frequency effectively encode the data of the data signal. Some FM transmitters implement frequency modulation by injecting the data signal into the divider block 150 along with PLLout 140. In such implementations, when no data signal is present (i.e., only PLLout 140 is present at the input to the divider block 150), the PLL system 100 would be configured to output the carrier signal (i.e., $f_{OUT}$ would be a desired carrier frequency). When both PLLout 140 and a data signal are present at the input of the divider block 150, the data signal can affect the frequency of the signal output by the divider block 150 ($f_{FDBK}$ 107), thereby affecting the frequency of PLLout 140 ($f_{OUT}$), resulting in a modulated output of the PLL system 100.

In some applications, it is desirable for the PLL system 100 to output a fractional (i.e., non-integer) multiple of the reference frequency. In such applications, a so-called fractional divider can be used in the PLL system 100, and the fractional dividing value can be characterized as "N.F," where "N" is the integer portion of the fractional dividing value, and "F" is the fractional portion of the fractional dividing value. For example, using a fractional divider, the PLL system 100 seeks to lock four to a frequency that is N.F times $f_{REF}$. In some applications, such a fractional divider can be used to implement FM. For reference, a block diagram of a conventional implementation of a fractional divider block (indicated as 150') is shown. The illustrated fractional divider block 150' includes a first adder 152, a fractionalizer 154, a second adder 156, and an integer divider 158. The fractionalizer 154 operates to generate the fractional portion of the fractional dividing value ("F") as a function of a received data signal 146. For example, the value of F changes dynamically in response to changes in the data signal 146. In the illustrated implementation, the first adder 152 takes some base $F_0$ 143 value (e.g., corresponding to a carrier frequency) as one input, and takes the data signal 146 as its other input, such that the output of the first adder 152 is the sum of the two. The sum is the desired F 144, which effectively corresponds to the carrier modulated by the data signal 146). The output of the fractionalizer 154 is typically a changing integer value that time-averages to the desired F 144. The second adder 156 can then add the output of the fractionalizer 154 to a set value of N 142 (i.e., the integer portion of the fractional dividing value), such that the output of the second adder 156 is a changing integer value that time-averages to N.F. This changing integer value is fed into the integer divider 158. The integer divider 158 receives PLLout 140, and can generate a feedback signal as a function of dividing $f_{OUT}$ by the changing integer value output from the adder 156. Thus, the average of $f_{FDBK}$ 107 over time is effectively $f_{OUT}$ divided by N.F, as desired.

Conventional fractionalizers 154 are implemented to produce a desired F 144 as an average over time. Some such conventional fractionalizers 154 are implemented to generate a periodic function that averages over time to the desired F 144. For example, to achieve an F 144 of 0.5, such a fractionalizer 154 may generate a periodic stream of integers, such as "1 1 0 0 1 1 0 0 . . . ." While such an approach can accurately generate a desired fractional value, the periodicity of the change in the dividing value effectively causes $f_{FDBK}$ 107 to change at a constant period. This periodic change in $f_{FDBK}$ 107 can manifest as constant power in one or more particular frequencies, thereby resulting in spurious energy ("spurs") and/or other undesirable artifacts that can corrupt PLLout 140. To minimize such artifacts, other conventional implementations of fractionalizers 154 can use a so-called "sigma-delta" architecture. Rather than using a periodic function to produce desired time-averaging, sigma-delta architectures can use pseudorandom functions to generate a stream of integers that time-averages to the desired F 144. For example, to achieve an F 144 of 0.5, such a fractionalizer 154 may generate a stream of integers, such as "1 2–2 0–1 0 1 1 0–2 . . . ." Because the functions are not perfectly random, some artifacts (e.g., spurs) can still manifest on PLLout 140, but such artifacts are typically reduced in power and spread manifesting as a minimal increase in the noise floor. Further, some such architectures can use noise shaping, or other techniques, to push the noise out of band.

Figure 2A:
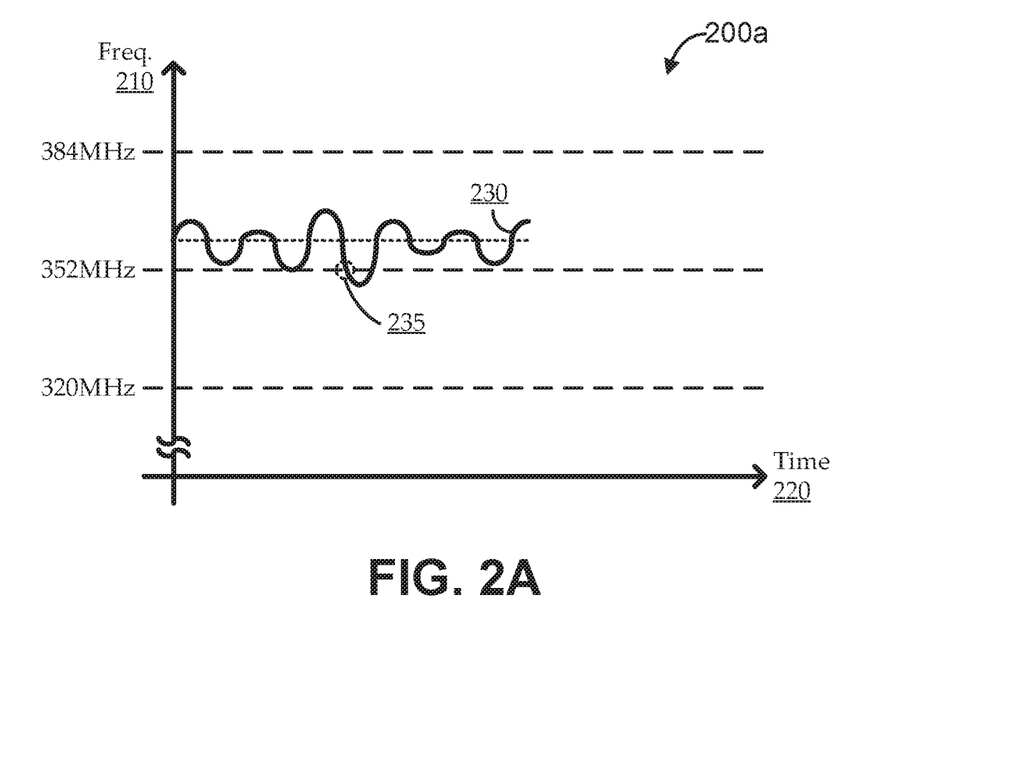
FIGS. 2A and 2B show plots corresponding to a portion of an illustrative frequency modulated signal and a corresponding modulation of an illustrative fractional dividing value to generate a signal using a conventional fractional divider PLL.
Figure 2B:
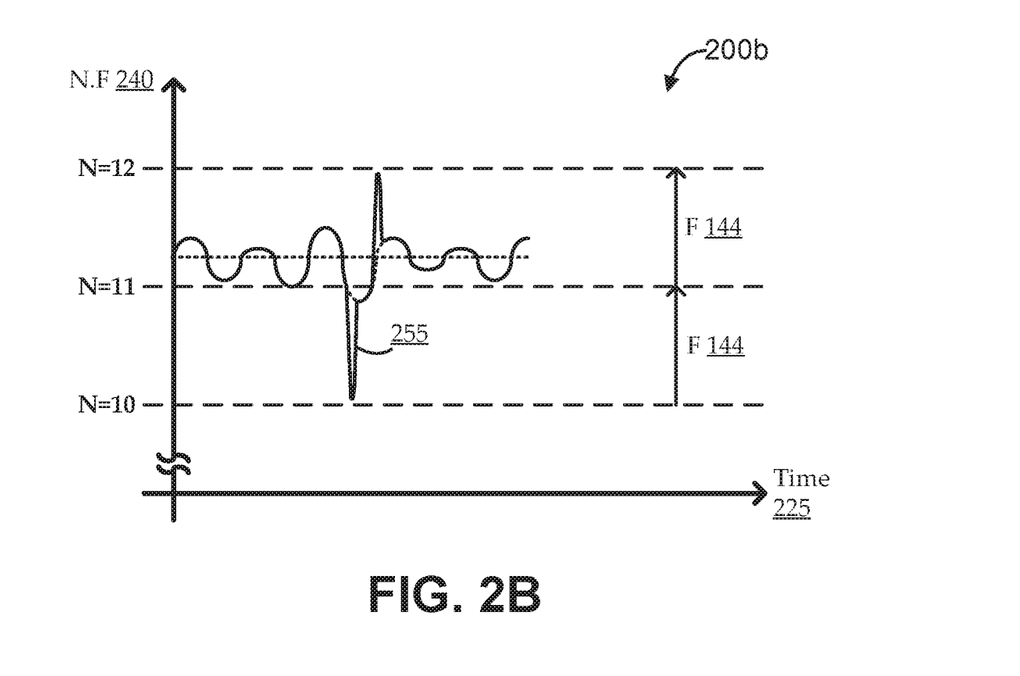

While such conventional fractional divider blocks 150' can be effective in many applications, embodiments described here recognize and seek to address a limitation to such conventional fractional divider blocks 150' that arise in certain circumstances. Such circumstances are illustrated by FIGS. 2A and 2B. FIGS. 2A and 2B show plots 200 corresponding to a portion of an illustrative frequency modulated signal 230 and a corresponding modulation of an illustrative fractional dividing value (N.F) 240 to generate the signal 230 using a conventional fractional divider PLL. Turning to FIG. 2A, a first plot 200a is shown of a portion of the illustrative frequency modulated signal 230. As shown, the frequency 210 of the signal 230 changes over time 220. For example, the signal 230 represents a data signal used to modulate the frequency of a carrier; the carrier can be at 360 Megahertz (MHz), and the bandwidth of the signal 230 can be around 16 MHz. FIG. 2B shows corresponding N.F values 240 that can be used to generate the signal 230 using a conventional fractional divider PLL, such as the one described with reference to FIG. 1. For example, using a $f_{REF}$ of 32 MHz at the input to the PLL, and using an integer divider value of N=11, the PLL will seek to lock four to N times $f_{REF}$, or 352 MHz. Similarly, using a fractional dividing value (N.F) 240 of 11.25 can yield an four of 360 MHz (i.e., 32 MHz times 11.25). In such a case, N 142 would be set to 11, and F 144 would be set to 0.25. It can be assumed that F 144 can be any integer between zero and some maximum number (e.g., "999"), for example, depending on the number of bits used to represent F 144.

As illustrated, changing the frequency 210 of the signal 230 involves a corresponding change in N.F 240. For example, beginning at the far left of the plot, the frequency 210 starts roughly at the carrier frequency, and N.F 240 begins roughly at 11.25. As the frequency 210 increases, N.F 240 increases, accordingly. Notably, the N 142 portion of N.F 240 can stay the same (e.g., N=11), while the F 144 portion of N.F 240 increases. Such continues to be the case, with N 142 staying the same, and F 144 changing, until the signal 230 reaches the point labeled 235. At point 235, the frequency 210 of the signal 230 falls below 352 MHz, corresponding to an N.F 240 value of 11.0 (i.e., N=11, and F=0). Just past that point 235, the N 142 component of N.F 240 reduces by one, and the F 144 component of N.F 240 jumps to a value at or near its maximum value. For example, as the frequency 210 crosses 352 MHz, it is desirable for N.F 240 to be 11.01, then 11.00, then 10.99.

Referring back to the illustrative fractional divider block 150' in FIG. 1, there is a difference in signal path between the inputs to the second adder 156. In particular, one input of the second adder 156 is directly tied to N 142, while the other input to the adder 156 is tied to F 144 through the fractionalizer 154. Thus, the path delay over which a change in N 142 is reflected at its corresponding input to the second adder 156 is shorter than the path delay over which a change in F 144 is reflected at its corresponding input to the second adder 156. When N 142 is staying constant and only F 144 is changing, this path delay does not practically impact operation of the PLL (e.g., other than contributing to a slight and consistent delay between modulations in the data signal and corresponding modulations in PLLout 140). However, when both N 142 and F 144 change concurrently, the different path delays may cause those changes to be reflected incorrectly in the generated N.F 240.

For example, turning back to FIGS. 2A and 2B, in association with the frequency 210 of the signal 230 falling below 352 MHz (corresponding to N.F 240 being 11.0), there is a large deviation in the effective N.F 240 value. As the frequency 210 crosses 352 MHz, the N 142 component of N.F 240 can change from 11 to 10 relatively quickly (e.g., because of the short path delay), while the change in the F 144 component of N.F 240 may take a longer time to jump from a very low value (e.g., at or near 0) to a very high value (e.g., at or near its maximum value) due to its longer path delay. For example, the value of N.F 240 may progress as follows: 11.04, 11.02, 11.00, 10.00, 10.50, 10.90, 10.93, 10.92, . . . . An illustration of this occurrence is shown as spike 255 in FIG. 2B. Also as illustrated, a similar spike can occur when the frequency 210 crosses back over 352 MHz. For example, the value of N.F 240 may progress as follows: 10.96, 10.98, 11.00, 12.00, 12.50, 12.10, 12.03, 12.04, . . . .

Figure 3:
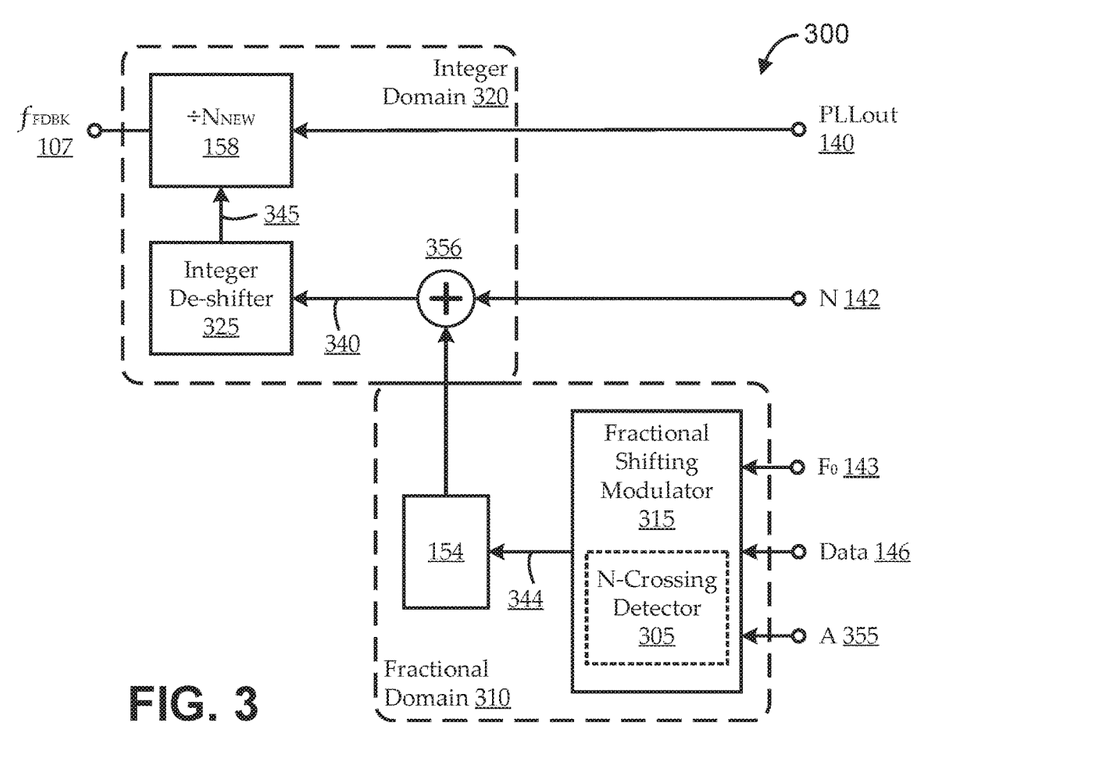
FIG. 3 shows a block diagram of an illustrative shifting fractional divider system, according to various embodiments.

Embodiments described herein include novel implementations of fractional dividers that can maintain accurate generation of N.F even for FM signals that cross an N boundary. FIG. 3 shows a block diagram of an illustrative shifting fractional divider system 300, according to various embodiments. The shifting fractional divider system 300 can be implemented as part of a fractional divider PLL, such that the shifting fractional divider system 300 can enable a PLL to output an output signal having an output frequency that is a fractional (i.e., non-integer) multiple of the reference frequency of its input signal. The shifting fractional divider system 300 can include a fractional domain portion 310 and an integer domain portion 320.

The fractional domain portion 310 includes a fractional shifting modulator 315 and a fractionalizer 154. The fractionalizer 154 can operate substantially as described above to output a sequence of integer values that time-average to a desired F value received at its input. For example, the fractionalizer 154 can be implemented using a sigma-delta architecture, or in any other suitable manner. Generation of the F value is performed by the fractional shifting modulator 315 in accordance with a base fractional component ($F_O$) 143, a data signal 146, and a shift value (A) 355, such that the F value is generated as a shifted F value 344. In general, shifted F 344 is generated to reflect $F_O$ 143 (e.g., corresponding to a fractional component of a carrier frequency) as modulated by the data signal 146. However, in generating shifted F 344, the fractional shifting modulator 315 also seeks to avoid situations in which both the N and F components of N.F change concurrently (e.g., as described above) by applying shifting to F selectively.

Embodiments of the fractional shifting modulator 315 make a determination as to whether the N.F value is likely to change in a manner that crosses an N boundary (e.g., where the N value changes, for example, from N=11 to N=10, or the like). In some implementations, such a determination can be made statically, such as by setting A 355 to a predetermined value. For example, if the carrier frequency and bandwidth of the data signal 146 are known, it can be predetermined whether N.F will likely have to cross an N-boundary to track the modulating data signal 146. In other implementations, such a determination can be made dynamically using an N-crossing detector 305. Embodiments of the N-crossing detector 305 can be implemented as part of the fractional shifting modulator 315, or as a separate component, automatically to generate A 355 responsive to detecting N-boundary crossing conditions. Some implementations of the N-crossing detector 305 can monitor F and/or N.F to detect when the F value approaches a minimum and/or maximum value, indicating that the N.F value is approaching an N-boundary; and can adjust A 355, accordingly. Other embodiments of the N-crossing detector 305 can monitor the frequency of PLLout 140, of the data signal 146, and/or of any other suitable signal to detect when the frequency is approaching a frequency corresponding to an N-boundary; and can adjust A 355, accordingly. Adjusting A 355 can effectively shift F by some amount. For example, adjusting A can effectively shift $F_O$ 143 to be further from an N-boundary, as needed.

Using the shifted F 344 as the input to the fractionalizer 154 can cause the output of the fractionalizer 154 (and the output of the fractional domain portion 310 of the shifting fractional divider system 300) to be a shifted fractional portion of the dividing value. The shifted output of the fractionalizer 154 can be added to N 142 by an adder 356 to generate a shifted modulating N 340 that time-averages to a shifted N.F (shifted according to A 355). The shifted modulating N 340 is shifted in such a way that N and F do not change concurrently, thereby avoiding conventional limitations stemming from differences in path delay between the N and F paths. The shifted modulating N 340 can be received, in the integer domain portion 320 of the shifting fractional divider system 300, by an integer de-shifter 325. Embodiments of the integer de-shifter 325 can include any suitable components to remove the shift from the shifted modulating N 340 to generate a de-shifted modulating N 345. The de-shifted modulating N 345 time-averages to the desired N.F (without any shift), which can be used by the divider 158 to generate a feedback signal of frequency $f_{FDBK}$ 107 from the PLLout 140 signal. Thus, the shifting can be used to avoid N-boundary crossings and related path delay concerns within the shifting fractional divider system 300, without shifting the frequency of the feedback signal or PLLout 140.

In some embodiments, the shifting fractional divider system 300 includes multiple input nodes. As illustrated, the input nodes can receive a dividing value signal that indicates a base dividing value (i.e., having a base integer component, N 142, and a base fractional component, $F_O$ 143). The input nodes can also receive some or all of the data signal 146 and PLLout 140. In some embodiments, the input nodes can further receive a shift input signal (A 355). Embodiments of the fractional shifting modulator 315 are coupled with at least some of the input nodes to generate the shifted fractional component value (shifted F 344) as a function of the base fractional input signal 143, the data signal 146, and the shift input signal 355. In some implementations, the fractional shifting modulator 315 includes a first scaler block to scale the data signal by the shift input signal to generate a scaled data signal, a second scaler block to scale the base fractional component by the shift input signal to generate a scaled base fractional component, and a set of adders to generate the shifted fractional component value by adding the shift input signal, the scaled data signal, and the scaled base fractional component. In some such implementations, the scaler blocks can multiply or divide by A 355, as appropriate. For example, where A 355 indicates a shift value of $2^{\wedge}(-S)$ (e.g., S is a non-zero integer, such that A 335 is 0.5, 0.25, or another suitable shift value), the scaler blocks can be multipliers; and where A 355 indicates a shift value of $2^{\wedge}(S)$ (e.g., such that A 335 is 2, 4, or another suitable shift value), the scaler blocks can be dividers.

The shift value indicated by A 355 can be determined and/or controlled in any suitable manner. In some embodiments, A 355 can be manually or digitally preset to a desired value. For example, where the base dividing value is known and is unchanging, a suitable value of A 355 can be predetermined. In some such embodiments, rather than the shift value being settable by A 335, the shift value is hard-coded. For example, one or more shift values is hard-coded and can be selected, and/or selectively activated, as appropriate. However, in some applications, the base dividing value (and or characteristics of the data signal 146) is unknown or is changing. For example, in an FM tuner, in software-defined radio, and/or in other applications, the carrier frequency (e.g., which can dictate the base dividing value) can change, and/or the bandwidth (e.g., swing) of the data signal 146 can change. As such, it can be desirable to have dynamic (e.g., automated) control over A 355. As such, some embodiments include the N-crossing detector 305 to monitor at least one of the input nodes to detect an N-boundary crossing condition, and to assert (e.g., turn on, turn off, adjust the indicated shift value of, etc.) the shift input signal 355 in accordance with detecting the N-boundary crossing condition. In some implementations, the N-crossing detector 305 can, in response to determining absence of an N-boundary crossing condition at a first time, adapt the shift input signal not to add any shifting as part of the generating the shifted fractional component value (e.g., to indicate a shift value of zero); and can, in response to determining presence of an N-boundary crossing condition at a second time, adapt the shift input signal to add shifting as part of the generating the shifted fractional component value (e.g., to indicate a non-zero shift value). In some implementations, determining the N-boundary crossing condition involves monitoring N 142 to detect when N 142 is less than a threshold distance away from an N-boundary, and asserting A 355 in response to detecting that N 142 is less than the threshold distance away from the N-boundary. For example, if the shifting fractional divider system 300 is being used in an environment in which the bandwidth of the data signal 146 is always B, regardless of the carrier frequency, an N-boundary crossing condition can be detected whenever N 142 is less than B/2 (e.g., plus a guard band) away from an N-boundary (i.e., an integer multiple of the reference frequency). In other implementations, determining the N-boundary crossing condition involves monitoring a bandwidth of the data signal 146 to detect when modulating the base dividing value by the data signal 146 is predicted to cross an N-boundary, and asserting A 355 in response to detecting such a case. For example, if the shifting fractional divider system 300 is being used in an environment in which the carrier frequency (e.g., $f_{REF} \times N.F_0$) stays relatively constant, but the bandwidth (B) of the data signal 146 is changing, an N-boundary crossing condition can be detected whenever B/2 is less than the distance between any N-boundary and $f_{REF} \times F_0$. In some embodiments, the shift value indicated by A 355 is a single value (e.g., 0.5). In other embodiments, the shift value indicated by A 355 is selectable from one or more preset shift input values in accordance with detecting the N-boundary crossing condition. For example, for certain N-boundary crossing conditions, too small of a shift value may be insufficient to address the N-boundary crossing condition; and/or too large of a shift value may cause another N-boundary crossing condition.

The fractionalizer 154 can be coupled with the fractional shifting modulator 315 to generate a first stream of integers responsive to receiving the shifted fractional component value 344, such that the first stream of integers time-averages to the shifted fractional component value. In some implementations, the fractionalizer 154 includes a delta-sigma modulator, or other components to generate the first stream of integers as a pseudorandom sequence with the desired time-average over a particular time window. In other implementations, the fractionalizer 154 generates the first stream of integers as a periodic sequence with the desired time-average over the particular time window.

The integer de-shifter 325 can be coupled with the fractionalizer 154 to generate a second stream of integers by de-shifting a sum of the first stream of integers and the base integer component, such that the second stream of integers time-averages to a modulated dividing value, the modulated dividing value corresponding to the base dividing value as modulated by the data signal. In some implementations, as illustrated, the adder 356 produces a third stream of integers that is the shifted modulating N 340, corresponding to the sum of the first stream of integers and N 142. In such implementations, the second stream of integers is the de-shifted modulating N 345, which is generated by the integer de-shifter 325 as a function of the third stream of integers (which is the shifted modulating N 340). In some implementations, the integer de-shifter 325 includes a de-scaler block to de-scale the shifted fractional component value according to the shift input signal to remove scaling applied by the fractional shifting modulator 315, and/or a de-shifter block to de-shift the shifted fractional component value to remove shifting applied by the fractional shifting modulator 315. The divider 158 can be coupled with the integer de-shifter 325 to generate the feedback signal as a function of sequentially dividing a frequency of PLLout 140 by the second stream of integers (i.e., by the de-shifted modulating N 345). As described herein, embodiments of the divider 158 can be disposed in a feedback path of a PLL, such that PLLout 140 is received by the divider from an output of the PLL, and the feedback signal is communicated from the divider 158 to a phase comparator at an input of the PLL.

Figure 4:
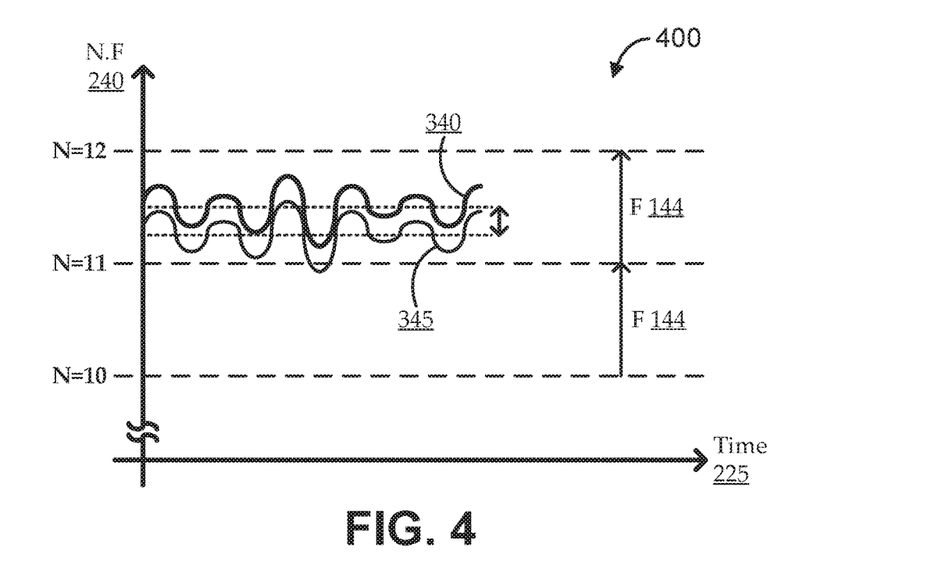
FIG. 4 shows a plot of illustrating operation of a fractional divider system, such as the shifting fractional divider system of FIG. 3.

For added clarity, FIG. 4 shows a plot 400 of illustrating operation of a fractional divider system, such as the shifting fractional divider system 300 of FIG. 3. The plot 400 shows changes in N.F 240 over time 225 for a data signal, such as the one shown in FIG. 2A. As described with reference to FIGS. 2A and 2B, there are points (e.g., point 235) at which the frequency of the signal falls below an N-boundary (e.g., 352 MHz). In such a case, without any shifting, may cause the N and F components of N.F 240 to change concurrently; and differences in path delay can cause such a concurrent change to result in an undesirable spike in the generated N.F. Referring to FIG. 3, embodiments can detect that the signal will (or is likely to) cross an N-boundary, and can apply a shift by adjusting A 355. With the applied shift, a shifted modulating N 340 is generated, which can effectively avoid any concurrent change of N and F, for example, as illustrated in FIG. 4. The integer de-shifter 325 can then remove the shift in a portion of the shifting fractional divider system 300 that is not susceptible to path delay differences between the N and F paths, resulting in the de-shifted modulating N 345. As illustrated, the de-shifted modulating N 345 can effectively match the un-shifted curve shown in FIG. 2B, except without any of the spikes at the N-boundary crossings. For example, while the un-shifted curve of FIG. 2B may have N.F 240 values around the N-boundary crossing of 11.04, 11.02, 11.00, 10.00, 10.50, 10.90, 10.93, 10.92, . . . (which includes a spike around the crossing point as the value jumps from 11.00 to 10.00, then begins to recover); the shifted modulating N 340 (e.g., assuming a shift of 0.25) may result in N.F 240 values around the N-boundary crossing of 11.29, 11.27, 11.25, 11.23, 11.21, 11.19, 11.18, 11.17, . . . ; and the de-shifted modulating N 345 may result in N.F 240 values around the N-boundary crossing of 11.04, 11.02, 11.00, 10.98, 10.96, 10.94, 10.93, 10.92, . . . (i.e., the first and last values of the de-shifted modulating N 345 match those generated without any shifting, but the values of the de-shifted modulating N 345 closer to the N-boundary crossing do not show any of the spikes present without any applied shifting).

Figure 5:
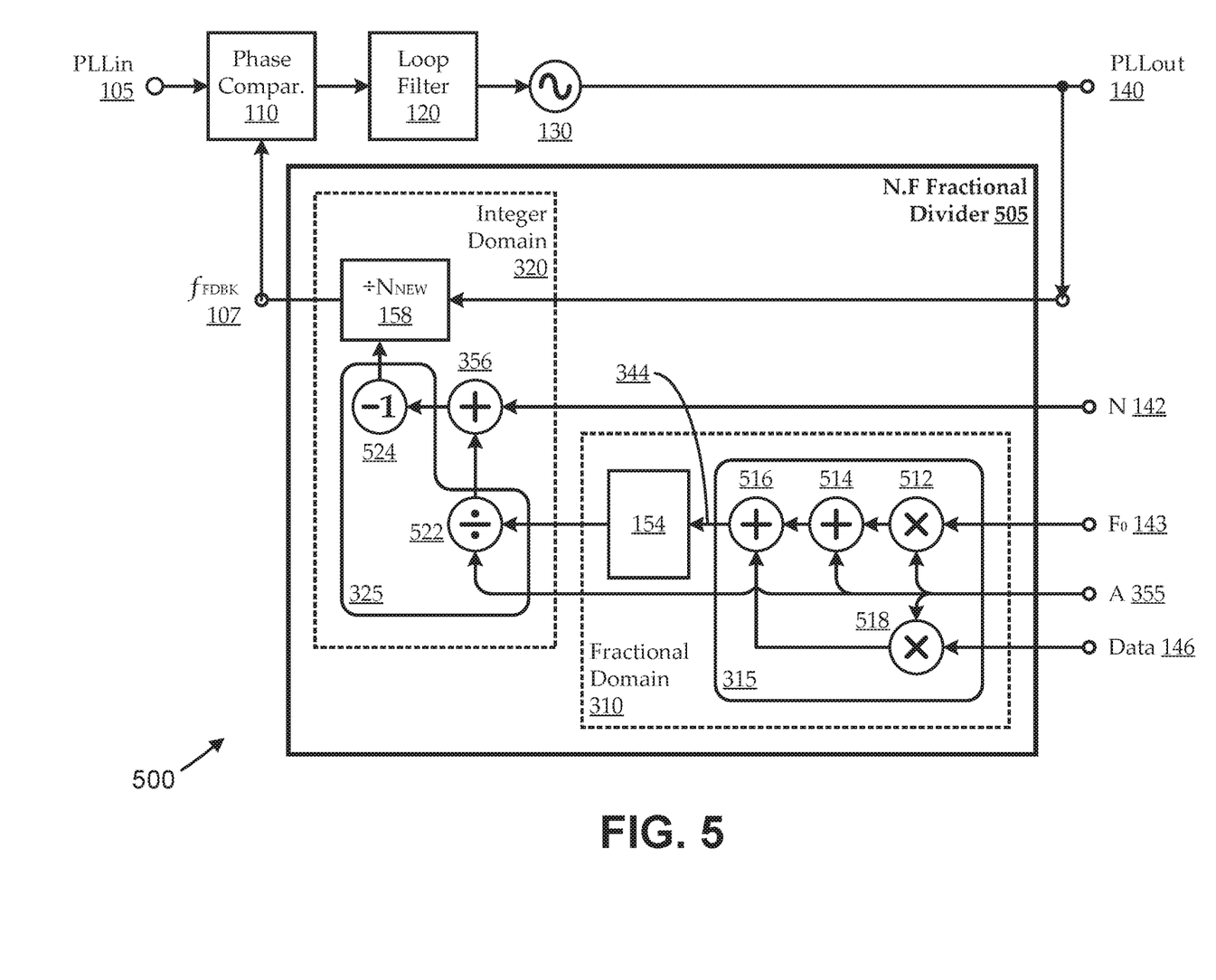
FIG. 5 shows an illustrative fractional divider phase-locked loop system that includes an illustrative implementation of a shifting fractional divider, according to various embodiments.

FIG. 5 shows an illustrative fractional divider phase-locked loop (PLL) system 500 that includes an illustrative implementation of a shifting fractional divider, according to various embodiments. As described above, the PLL system 500 can include a phase comparison block 110, a loop filter block 120, an oscillator block 130, and an N.F fractional divider subsystem 505. The fractional divider subsystem 505 can be an implementation of the fractional divider system 300 of FIG. 3. As described with reference to FIG. 3, the fractional divider subsystem 505 can include a fractional domain portion 310 and an integer domain portion 320. The fractional domain portion 310 includes a fractional shifting modulator 315 to generate a shifted F 344, which can be used by a fractionalizer 154 to generate a sequence of integers that time-average to the shifted F 344 value. N 142 can then be added to the sequence of integers output from the fractionalizer 154 (by adder 356) to produce a sequence of integers (a shifted modulating N) that time-averages to a shifted N.F. In the integer domain portion 320, an integer de-shifter 325 can remove the shift from the shifted modulating N values to generate a de-shifted modulating N, which time-averages to the desired N.F. The de-shifted modulating N can be used by a divider 158 to generate a feedback signal having a frequency of $f_{FDBK}$ 107, which, on average, corresponds to the frequency of PLLout 140 ($f_{OUT}$) divided by N.F, even as N.F changes in accordance with modulations from the data signal 146.

As illustrated, the fractional shifting modulator 315 can be implemented using a first multiplier block 512, a second multiplier block 518, a first adder block 514, and a second adder block 516. The first multiplier block 512 multiplies a base fractional component ($F_0$) 143 by a shift value (A) 355, and the second multiplier block 518 multiplies the data signal (D) 146 by the shift value (A) 355. Thus, the output of the first multiplier block 512 can be characterized as A×$F_0$, and the output of the second multiplier block 518 can be characterized as A×D. A 355 can be generated in any suitable manner. As described above, A 355 can be generated manually or automatically. Further, A can be any suitable value, such as a single fixed value, a selected one of multiple predetermined values, a dynamically generated value, etc., that can be selectively asserted or de-asserted to apply or remove shifting. Though not shown to avoid overcomplicating the figure, the fractional divider subsystem 505 can include an N-crossing detector 305 that automatically generates A 355 (e.g., dynamically generates, asserts, etc.) responsive to detecting an N-boundary crossing condition (e.g., a condition indicating an impending, predicted, or possible N-boundary crossing).

The first adder block 514 can add A 355 to the output of the first multiplier block 512, thereby outputting A+(A×$F_0$), or A×(1+$F_0$). The second adder block 516 can add the output of the first adder block 514 to the output of the second multiplier block 518, thereby outputting A+(A×$F_0$)+(A×D), or A×(1+$F_0$+D). This output of the second adder block 516 can be the shifted F 344, which can be used as the input to the fractionalizer 154. In some embodiments, A 355 is selected as one or more values that are simple to implement using digital (e.g., binary) components. For example, if A 335 is 0.5, multiplying or dividing by A 335 can be implemented simply by removing or adding a least significant bit (e.g., using a shift register), respectively. In such an example, the input to the fractionalizer 154 is effectively 0.5×(1+$F_0$+D). The fractionalizer 154 can generate a sequence of integers that time-average to the shifted F 344.

The integer de-shifter 325 can include a division block 522 and a subtraction block 524. Notably, the output of the fractionalizer 154 is scaled by a factor of A 335. The division block 522 can effectively de-scale the shifted F 344 by dividing the output of the fractionalizer 154 by A 335. Thus, the output of the division block 522 can be characterized as A×(1+$F_0$+D)/A, which equals 1+$F_0$+D. The output of the division block 522 can be fed to adder 356, which can add that output to N 142. The output of adder 356, then, can be characterized as N+1+$F_0$+D. This can be fed to the subtraction block 524, which can subtract by '1', such that the output of the integer de-shifter 325 can be characterized as N+$F_0$+D. This result corresponds to a changing sequence of integer values that time-averages to the desired modulating N.F, which can be used by the divider 158 to generate the feedback signal from the PLLout 140 signal.

While FIG. 5 shows a particular implementation of the fractional divider subsystem 505, modifications can be made without appreciably impacting the functionality described above. For example, components shown as multipliers can be implemented as dividers by setting A 335 to its reciprocal (e.g., multiplying by A=0.5 is essentially equivalent to dividing by A=2). Further, components can be distributed and/or combined in any suitable manner. For example, while the division block 522 is shown as part of the integer de-shifter 325, it can be implemented as a separate component in other embodiments.

Figure 6:
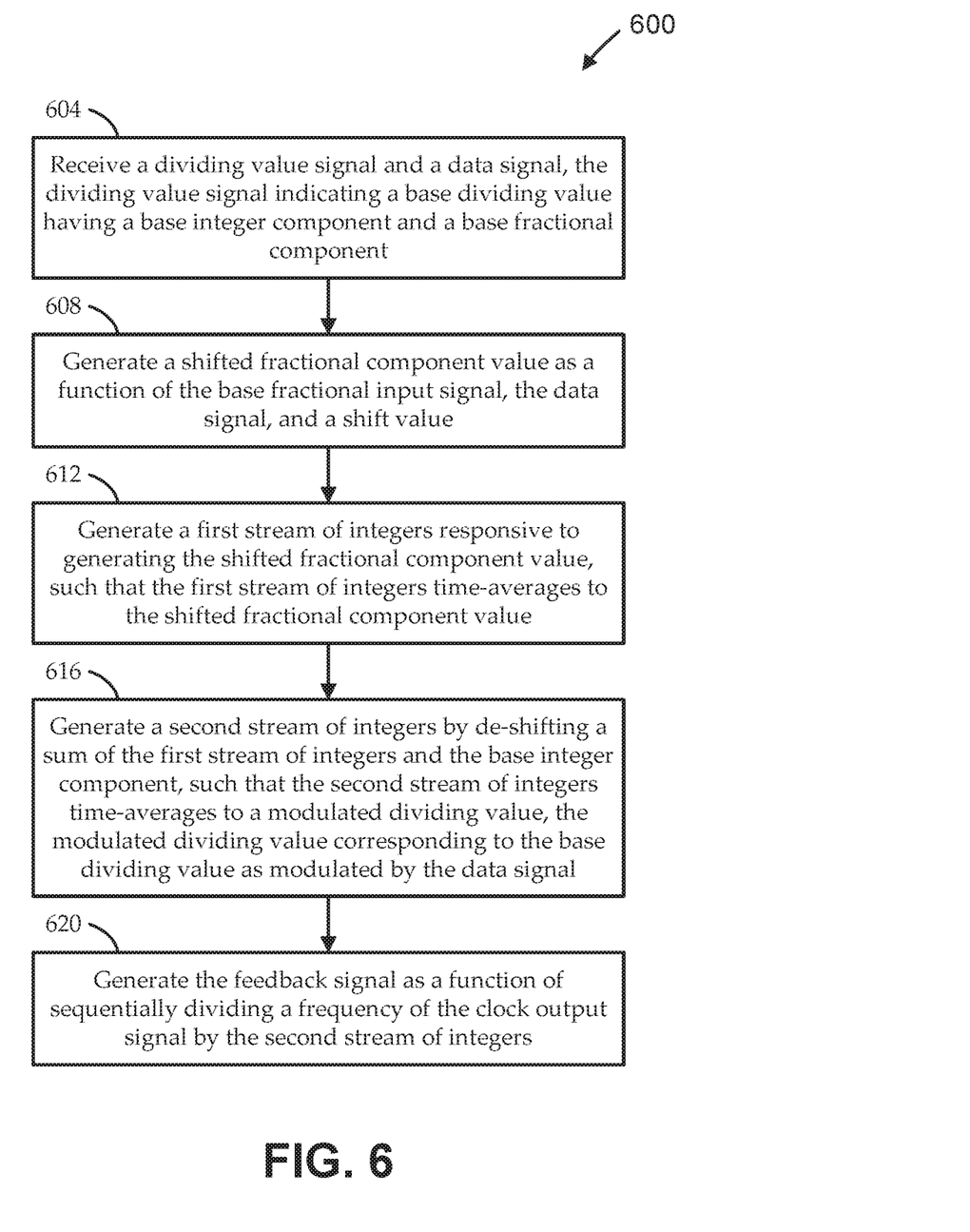
FIG. 6 shows a flow diagram of an illustrative method for fractionally dividing a clock output signal to generate a feedback signal, according to various embodiments.

FIG. 6 shows a flow diagram of an illustrative method 600 for fractionally dividing a clock output signal to generate a feedback signal, according to various embodiments. Embodiments of the method 600 begin at stage 604 by receiving a dividing value signal and a data signal. The dividing value signal can indicate a base dividing value (e.g., N.F) having a base integer component (N) and a base fractional component ($F_0$). At stage 608, embodiments can generate a shifted fractional component value as a function of the base fractional input signal, the data signal, and a shift value. For example, the shifted fractional component value represents the base fractional component, as modulated by the data signal, and as shifted by the shift value (e.g., as set by a shift input signal, hard-coded, etc.). As described herein, the shift value (e.g., shift input signal) can be applied selectively to shift the fractional component of the dividing value away from N-boundaries, where desired.

At stage 612, embodiments can generate a first stream of integers responsive to generating the shifted fractional component value, such that the first stream of integers time-averages to the shifted fractional component value. At stage 616, embodiments can generate a second stream of integers by de-shifting (e.g., removing shifting and/or scaling of) a sum of the first stream of integers and the base integer component, such that the second stream of integers time-averages to a modulated dividing value. The modulated dividing value corresponds to the base dividing value as modulated by the data signal. For example, the generating at stage 616 can essentially remove the impact of the shift input signal. At stage 620, embodiments can generate the feedback signal as a function of sequentially dividing a frequency of the clock output signal by the second stream of integers. Effectively, the generating at stage 620 involves integer dividing of the clock output signal frequency to generate a feedback signal with a feedback frequency, and the integer dividing value changes in accordance with the second stream of integers in a manner that time-averages to a desired modulating fractional dividing value.

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising" "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A fractional divider phase-locked loop (PLL) system comprising:
    a phase comparison block to output a phase comparison signal as a function of comparing an input reference clock signal with a feedback signal, the input reference clock signal received at a reference frequency, and the feedback signal received at a feedback frequency;
    a loop filter block coupled with the phase comparison block to output a control signal as a function of filtering the phase comparison signal;
    an oscillator block coupled with the loop filter block to output a clock output signal at an output frequency responsive to the control signal; and
    a shifting fractional divider subsystem comprising:
        a plurality of input nodes to receive the clock output signal, a dividing value signal, a shift input signal, and a data signal, the dividing value signal indicating a base dividing value having a base integer component and a base fractional component;
        a fractional shifting modulator coupled with at least some of the plurality of input nodes to generate a shifted fractional component value as a function of the base fractional input signal, the data signal, and a shift value set by the shift input signal;
        a fractionalizer coupled with the fractional shifting modulator to generate a first stream of integers responsive to receiving the shifted fractional component value, such that the first stream of integers time-averages to the shifted fractional component value;
        an integer de-shifter coupled with the fractionalizer to generate a second stream of integers by de-shifting a sum of the first stream of integers and the base integer component, such that the second stream of integers time-averages to a modulated dividing value, the modulated dividing value corresponding to the base dividing value as modulated by the data signal;
        a divider coupled with the integer de-shifter to generate the feedback signal as a function of sequentially dividing a frequency of a clock output signal by the second stream of integers; and
        an output node coupled with the phase comparison block to provide the feedback signal to the phase comparison block, such that the output frequency is a multiple of the reference frequency, the multiple being controlled by the shifting fractional divider subsystem.

2. The fractional divider system of claim 1, wherein:
    the fractional shifting modulator comprises:
        a first scaler block to scale the data signal by the shift value to generate a scaled data signal;
        a second scaler block to scale the base fractional component by the shift value to generate a scaled base fractional component; and
        a set of adders to generate the shifted fractional component value by adding the shift input signal, the scaled data signal, and the scaled base fractional component; and
    the integer de-shifter comprises:
        a de-scaler block to remove scaling applied to the shifted fractional component value by the first and second scaler blocks; and
        a de-shifter block to remove shifting applied to the shifted fractional component value by the fractional shifting modulator.

3. A fractional divider system comprising:
    a plurality of input nodes to receive a dividing value signal, a shift input signal, and a data signal, the dividing value signal indicating a base dividing value having a base integer component and a base fractional component;
    a fractional shifting modulator coupled with at least some of the plurality of input nodes to generate a shifted fractional component value as a function of the base fractional input signal, the data signal, and a shift value set by the shift input signal;
    a fractionalizer coupled with the fractional shifting modulator to generate a first stream of integers responsive to receiving the shifted fractional component value, such that the first stream of integers time-averages to the shifted fractional component value;
    an integer de-shifter coupled with the fractionalizer to generate a second stream of integers by de-shifting a sum of the first stream of integers and the base integer component, such that the second stream of integers time-averages to a modulated dividing value, the modulated dividing value corresponding to the base dividing value as modulated by the data signal; and
    a divider coupled with the integer de-shifter to generate a feedback signal as a function of sequentially dividing a frequency of a clock output signal by the second stream of integers.

4. The fractional divider system of claim 3, wherein the fractional shifting modulator further comprises:
    a first scaler block to scale the data signal by the shift value to generate a scaled data signal;
    a second scaler block to scale the base fractional component by the shift value to generate a scaled base fractional component; and a set of adders to generate the shifted fractional component value by adding the shift value, the scaled data signal, and the scaled base fractional component.

5. The fractional divider system of claim 3, wherein:
the shift value is $2^{(-S)}$, wherein S is a non-zero integer; and
a first scaler block is to multiply the data signal by the shift value to generate the scaled data signal; and
a second scaler block is to multiply the base fractional component by the shift value to generate the scaled base fractional component.

6. The fractional divider system of claim 3, wherein the integer de-shifter comprises:
a de-scaler block to de-scale the shifted fractional component value according to the shift value to remove scaling applied by the fractional shifting modulator; and
a de-shifter block to de-shift the shifted fractional component value to remove shifting applied by the fractional shifting modulator.

7. The fractional divider system of claim 3, wherein the fractional shifting modulator comprises:
an N-crossing detector to monitor at least one of the plurality of input nodes to detect an N-boundary crossing condition, and to set the shift value to a preset shift input value in accordance with detecting the N-boundary crossing condition.

8. The fractional divider system of claim 7, wherein the N-crossing detector is to set the shift value to a preset shift input value by:
selecting the preset shift input value from a hard-coded plurality of preset shift input values in accordance with detecting the N-boundary crossing condition.

9. The fractional divider system of claim 3, further comprising:
a summer to generate a third stream of integers that is the sum of the first stream of integers and the base integer component,
wherein the integer de-shifter receives the third stream of integers and generates the second stream of integers as a function of the third stream of integers.

10. The fractional divider system of claim 3, wherein:
the divider is disposed in a feedback path of a phase-locked loop (PLL), such that the clock output signal is received by the divider from an output of the PLL, and the feedback signal is communicated from the divider to a phase comparator at an input of the PLL.

11. The fractional divider system of claim 3, wherein:
the fractionalizer comprises a delta-sigma modulator.

12. A method for fractionally dividing a clock output signal to generate a feedback signal, the method comprising:
receiving a dividing value signal, a shift input signal, and a data signal, the dividing value signal indicating a base dividing value having a base integer component and a base fractional component;
generating a shifted fractional component value as a function of the base fractional input signal, the data signal, and a shift value set by the shift input signal;
generating a first stream of integers responsive to generating the shifted fractional component value, such that the first stream of integers time-averages to the shifted fractional component value;
generating a second stream of integers by de-shifting a sum of the first stream of integers and the base integer component, such that the second stream of integers time-averages to a modulated dividing value, the modulated dividing value corresponding to the base dividing value as modulated by the data signal; and
generating the feedback signal as a function of sequentially dividing a frequency of the clock output signal by the second stream of integers.

13. The method of claim 12, wherein generating the shifted fractional component value comprises:
scaling the data signal by the shift value to generate a scaled data signal;
scaling the base fractional component by the shift value to generate a scaled base fractional component; and
generating the shifted fractional component value by adding the shift value, the scaled data signal, and the scaled base fractional component.

14. The method of claim 13, wherein:
the shift value is $2^{(S)}$, wherein S is a non-zero integer; and
the first scaler block is to divide the data signal by the shift value to generate the scaled data signal; and
the second scaler block is to divide the base fractional component by the shift value to generate the scaled base fractional component.

15. The method of claim 12, wherein generating the second stream of integers comprises:
de-scaling the shifted fractional component value according to the shift value; and
de-shifting the shifted fractional component value.

16. The method of claim 12, further comprising:
determining, at a first time, absence of an N-boundary crossing condition;
adapting the shift value, responsive to the determining at the first time, not to add any shifting as part of the generating the shifted fractional component value;
determining, at a second time, presence of an N-boundary crossing condition; and
adapting the shift value, responsive to the determining at the second time, to add shifting as part of the generating the shifted fractional component value in accordance with the N-boundary crossing condition.

17. The method of claim 12, wherein generating the shifted fractional component value comprises:
monitoring the base integer component to detect when the base integer component is less than a threshold distance away from an N-boundary; and
adjusting the shift value to a preset shift value in response to detecting that the base integer component is less than the threshold distance away from the N-boundary.

18. The method of claim 12, wherein generating the shifted fractional component value comprises:
monitoring a bandwidth of the data signal to detect when modulating the base dividing value by the data signal is predicted to cross an N-boundary; and
adjusting the shift value to a preset shift value in response to detecting that modulating the base dividing value by the data signal is predicted to cross an N-boundary.

19. The method of claim 12, wherein generating the second stream of integers comprises:
summing the first stream of integers and the base integer component to generate a third stream of integers; and
generating the second stream of integers as a function of the third stream of integers.

20. The method of claim 12, wherein the first stream of integers comprises a pseudorandom sequence of integers that time-averages, over a defined time window, to the shifted fractional component value.

\* \* \* \* \*